(12) United States Patent
Tu

(10) Patent No.: US 8,232,587 B2
(45) Date of Patent: Jul. 31, 2012

(54) METHOD OF FORMING A METAL-INSULATOR-METAL CAPACITOR

(75) Inventor: Kuo-Chi Tu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 291 days.

(21) Appl. No.: 12/683,224

(22) Filed: Jan. 6, 2010

(65) Prior Publication Data

US 2010/0109124 A1    May 6, 2010

Related U.S. Application Data

(62) Division of application No. 11/640,208, filed on Dec. 18, 2006, now Pat. No. 7,666,737.

(51) Int. Cl.
*H01L 29/94* (2006.01)
(52) U.S. Cl. .................. 257/308; 257/E29.343
(58) Field of Classification Search .................. 257/307, 257/308, E29.343
See application file for complete search history.

(56) References Cited

U.S. PATENT DOCUMENTS

| 5,843,822 A | * 12/1998 | Hsia et al. ..................... 438/254 |
| 6,114,201 A | 9/2000 | Wu |
| 6,624,018 B1 | 9/2003 | Yu et al. |
| 6,867,094 B2 | 3/2005 | Park |

* cited by examiner

*Primary Examiner* — Chandra Chaudhari
(74) *Attorney, Agent, or Firm* — Birch, Stewart, Kolasch & Birch, LLP

(57) ABSTRACT

A method of forming a metal-insulator-metal capacitor has the following steps. A stack dielectric structure is formed by alternately depositing a plurality of second dielectric layers and a plurality of third dielectric layers. A wet etch selectivity of the second dielectric layer relative to said third dielectric layer is of at least 5:1. An opening is formed in the stack dielectric structure, and then a wet etch process is employed to remove relatively-large portions of the second dielectric layers and relatively-small portions of the third dielectric layers to form a plurality of lateral recesses in the second dielectric layers along sidewalls of the opening. A bottom electrode layer is formed to extend along the serrate sidewalls, a capacitor dielectric layer is formed on the bottom electrode layer, and a top electrode layer is formed on the capacitor dielectric layer.

6 Claims, 5 Drawing Sheets

METHOD OF FORMING A METAL-INSULATOR-METAL CAPACITOR

This application is a Divisional of application Ser. No. 11/640,208, filed on Dec. 18, 2006 now U.S. Pat. No. 7,666,737, the entire contents of which are hereby incorporated by reference and for which priority is claimed under 35 U.S.C. §120.

TECHNICAL FIELD

The present invention relates to a method of manufacturing a capacitor of a semiconductor memory, and particularly to a method of forming a metal-insulator-metal (MIM) capacitor structure for a dynamic random access memory (DRAM) device.

BACKGROUND

The cell of a semiconductor memory such as a dynamic random access memory (DRAM) device is generally created comprising one single Metal-Oxide-Semiconductor Field-Effect-Transistor (MOS-FET) as a switching device connected with a capacitor as a digital data storage device. A capacitor known as a metal-insulator-metal (MIM) structure possesses a low-interfacial reaction specificity to enhance its performance. The MIM capacitor has therefore become an important topic of research for the memory technology in the future. As the DRAM device needs ultra-high integrity, cell areas are reduced, and thus many studies for increasing the capacitance of a MIM capacitor are being developed. There are various ways of increasing the capacitance such as forming a crown-shaped capacitor structure, whereby a surface area of a dielectric layer is increased. However, the conventional process needs to form a thick insulator layer in openings to increase the vertical dimension of the crown-shaped capacitor structure, resulting in a high aspect ratio of bit line contact holes for capacitor-over-bit line (COB) designs. The formation of the thick insulator layer increases process complexity and cost, and causes difficulties in anisotropically etching bit line contact holes with deep and narrow designs.

What is needed in the art, therefore, is a novel approach to increase capacitance and maintaining the capacitor height simultaneously to minimize an impact on the bit line contact aspect ratio.

SUMMARY OF THE INVENTION

Embodiments of the present invention include a MIM capacitor structure and a method of forming thereof to increase the total effective capacitance without impacting on bit line contact aspect ratio.

In one aspect, the present invention provides a method of forming a metal-insulator-metal capacitor including the following steps. A semiconductor substrate is provided with a first dielectric layer formed thereon. A stack dielectric structure is formed overlying the first dielectric layer by alternately depositing a plurality of second dielectric layers and a plurality of third dielectric layers. An opening is formed in the stack dielectric structure to expose a portion of the first dielectric layer. By performing a wet etch process, relatively-large portions of the second dielectric layers and relatively-small portions of the third dielectric layers are removed to form a plurality of lateral recesses in the second dielectric layers along sidewalls of the opening. A bottom electrode layer is formed to extend along the sidewalls and bottoms of the lateral recesses and the opening. A capacitor dielectric layer is formed on the bottom electrode layer. A top electrode layer is formed on the capacitor dielectric layer.

In another aspect, the present invention provides a metal-insulator-metal capacitor includes a semiconductor substrate having a first dielectric layer formed thereon and a stack dielectric structure overlying the first dielectric layer. The stack dielectric structure has a plurality of second dielectric layers and a plurality of third dielectric layers alternating with each other. A wet etch selectivity of the second dielectric layer relative to the third dielectric layer is of at least 5:1. An opening has serrate sidewalls passing through the stack dielectric structure and a bottom exposing a portion of the first dielectric layer. A bottom electrode layer is formed on the stack dielectric structure and the first dielectric layer along the serrate sidewalls and the bottom of the opening. A capacitor dielectric layer is formed on the bottom electrode layer. A top electrode layer is formed on the capacitor dielectric layer.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1A:
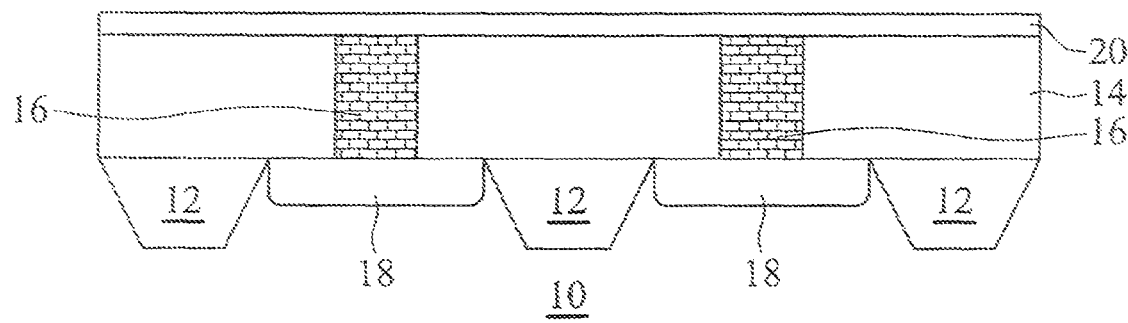
FIG. 1A to FIG. 1F are cross-sectional diagrams illustrating an exemplary embodiment of a method of forming a MIM capacitor for a DRAM device.

Embodiments of the present invention provide a MIM capacitor structure and a method of forming thereof. Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1A to FIG. 1F illustrate an exemplary embodiment of a method of forming a MIM capacitor for a DRAM device. In FIG. 1A, a semiconductor substrate 10 is provided with shallow trench isolation (STI) structures 12 formed therein and transistors (not shown) formed thereon. The transistor process may include, but not limited to, the formation of well regions, gate electrodes, lightly doped drain (LDD) structures, sidewall spacers, heavy doped source/drain regions and silicide layers. For example, dopant diffusion regions 18 are formed in the substrate 10 through ion implantation process. The transistor process is conventionally well known and no further detailed discussion is necessary. A first dielectric layer 14 is deposited on the semiconductor substrate 10 to cover the transistors and then planarized by a chemical mechanical planarization (CMP) process. The material used to form the first dielectric layer 14 may include, for example silicon oxide, silicon nitride, silicon oxynitride, low-k dielectric materials, other isolating materials, or combinations thereof. Next, photolithography and etch techniques are used to pattern the first dielectric layer 14 to form openings that are then filled with a conductive material to act storage node contact structures 16, being electrically connected to the underlying dopant diffusion regions 18 respectively. In addition, an etch stop layer 20 is deposited on the first dielectric layer 14 to cover the storage node contact structures 16. The material used to form the etch stop layer 20 may include, for example silicon nitride, silicon oxynitride, or combinations thereof.

Figure 1B:
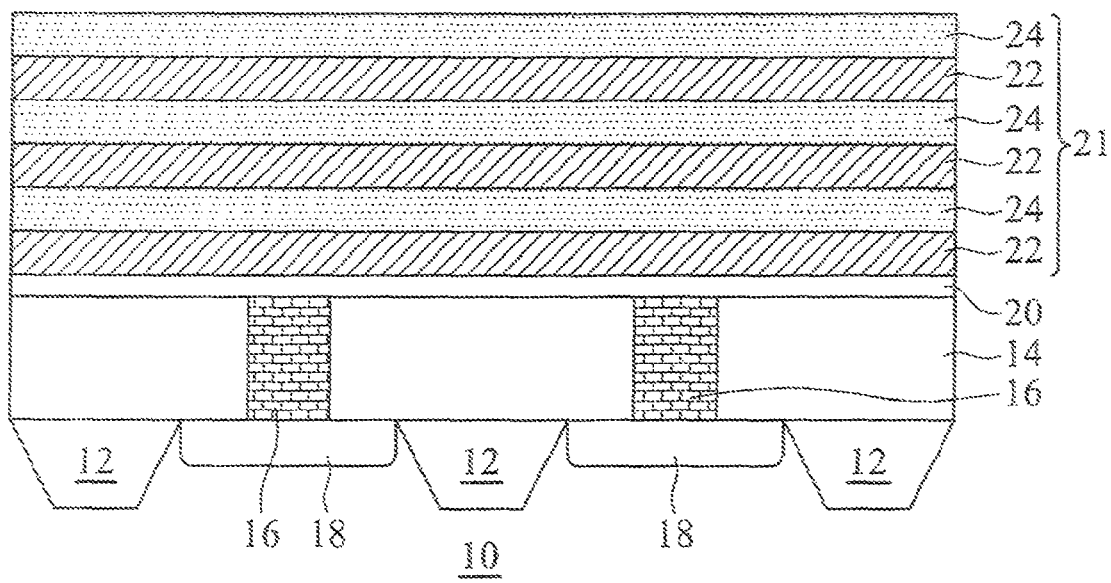

In FIG. 1B, a plurality of second dielectric layers 22 and a plurality of third dielectric layers 24 are alternately deposited to form a stack dielectric structure 21 on the etch stop layer 20 through any of a variety of techniques, including, LPCVD (low-pressure chemical vapor deposition), APCVD (atmospheric-pressure chemical vapor deposition), PECVD (plasma-enhanced chemical vapor deposition), spin-on coating, and future-developed deposition procedures. The material used to form the second dielectric layer 22 may include, for example silicon oxide, silicon nitride, silicon oxynitride, low-k dielectric materials, other isolating materials, or combinations thereof. The material used to form the third dielectric layer 24 may include, for example silicon oxide, silicon nitride, silicon oxynitride, low-k dielectric materials, other isolating materials, or combinations thereof. The key aspect of the invention is to provide the alternately deposited dielectric layers 22 and 24 with different wet etch rates for pulling back the second dielectric layers 22 in subsequent process. For example, the dielectric layers 22 and 24 may be formed of oxide-based materials with different wet etch rates. A wet etch selectivity of the second dielectric layer 22 relative to the third dielectric layer 24 is of at least 5:1 and at most 100:1.

Figure 1C:
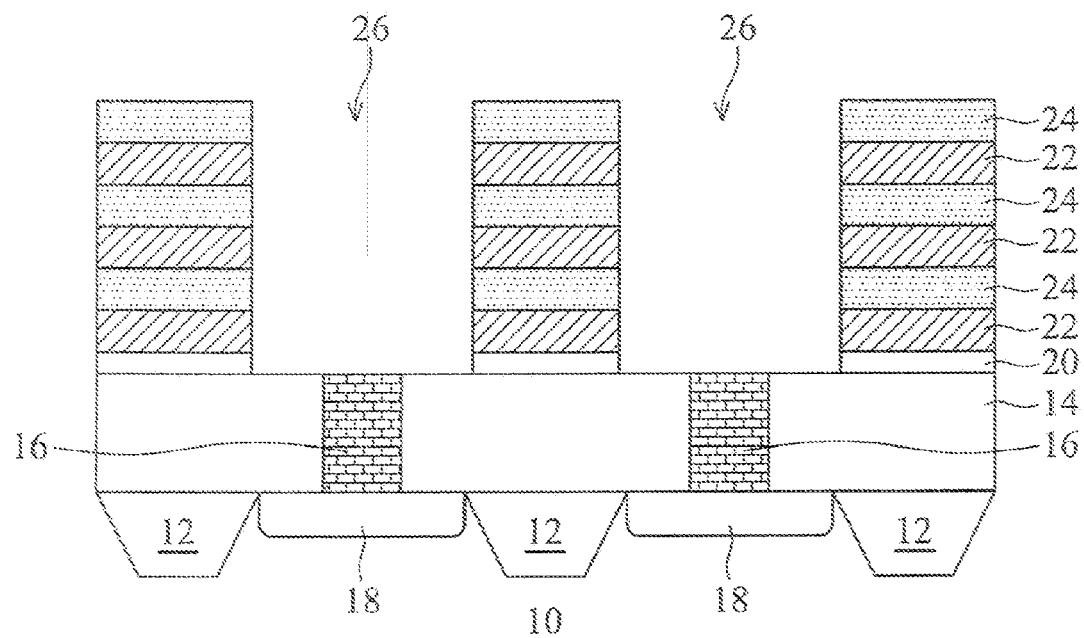
Figure 1D:
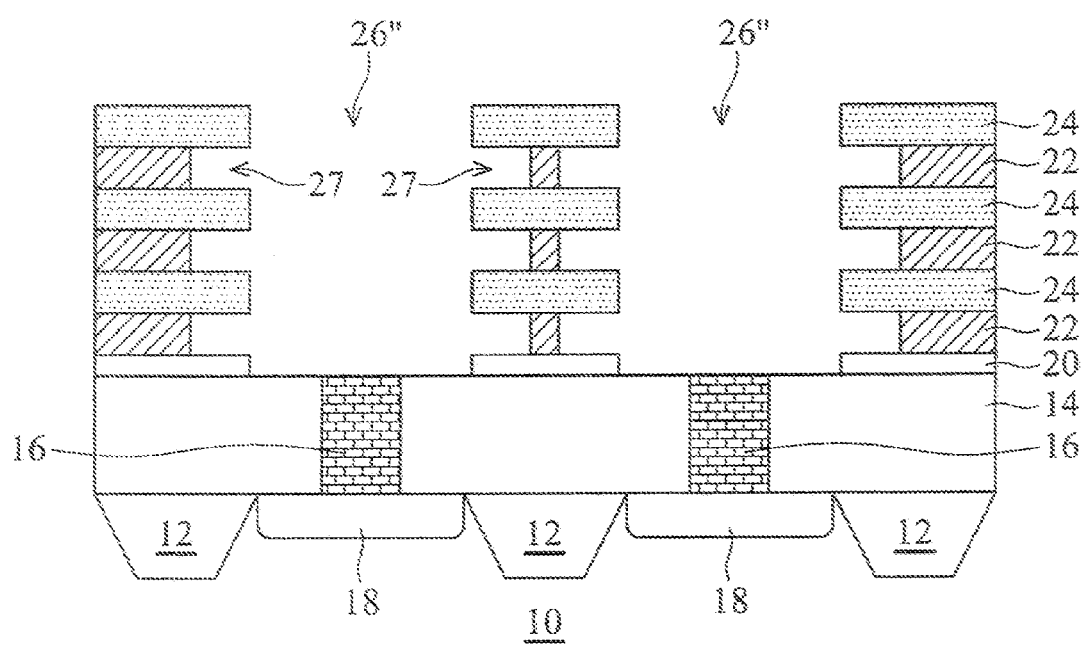

In FIG. 1C, photolithography and anisotropic etch techniques are used to pattern the dielectric layers 20, 22 and 24 to form capacitor openings 26, exposing the storage node contact structures 16 respectively. Then, in FIG. 1D, an isotropic etch process, such as a wet etch process, is employed to remove relatively-large portions of the second dielectric layers 22 and relatively-small portions of the third dielectric layers, resulting in a patterned opening 26" with serrate sidewalls. In detail, lateral recesses 27 are formed in the second dielectric layers respectively along the sidewall of the capacitor opening 26. The wet etch solution is tuned to obtain a high etch selectivity to the material in the second dielectric layer 22 relative to the material in the third dielectric layer 24 so as to form a desired serrate sidewalls profile. For example, a wet etch rate of the second dielectric layer 22 to the third dielectric layer 24 is from about 5:1 to about 100:1.

Figure 1E:
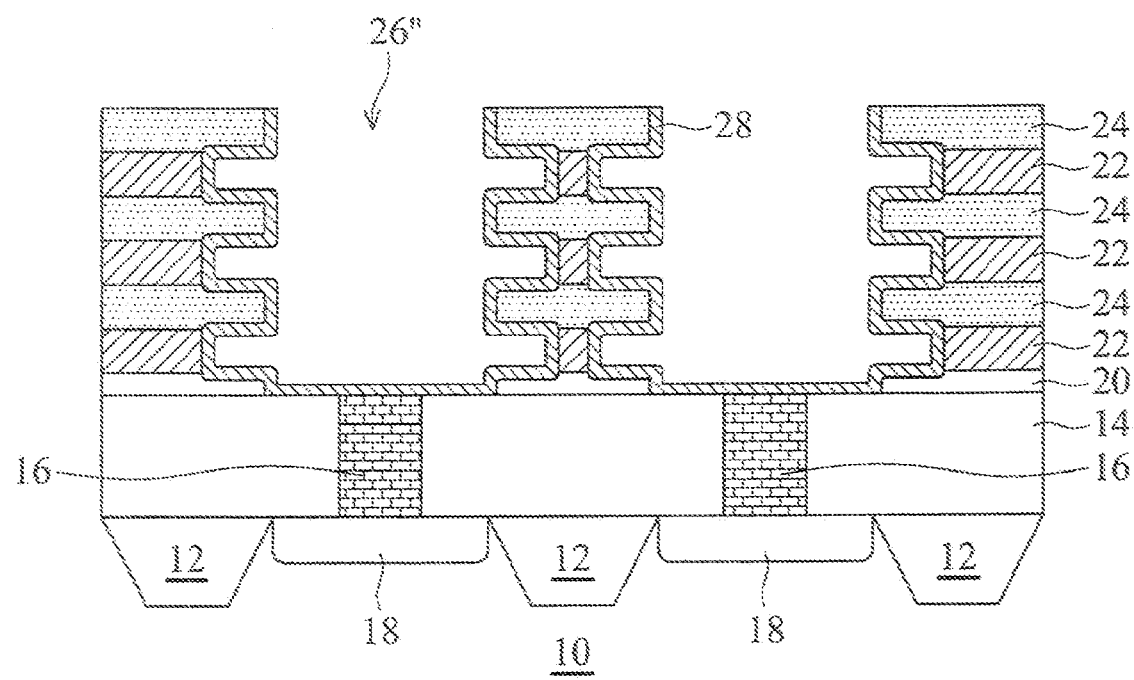

In FIG. 1E, a first conductive layer 28, serving as a bottom electrode layer 28 of a MIM capacitor, is conformally deposited on the resulted structure to cover the stack dielectric structure 21 along the serrate sidewall profile of the patterned opening 26". The first conductive layer 28 also covers the exposed regions of the first dielectric layer 14 to electrically contact the storage node contact structures 16. The material used to form the first conductive layer 28 may include, for example TiN, TaN, W, WN, Ti, TiW, Ta, Al, Cu, Mo, or the like. The blanket deposition for the first conductive layer 28 may include, but is not limited to, CVD, PVD (physical vapor deposition), evaporation, plating, ALD (atomic layer deposition), or combinations thereof. Then the first conductive layer 28 outside the patterned openings 26" is removed by CMP or etch back technologies.

Figure 1F:
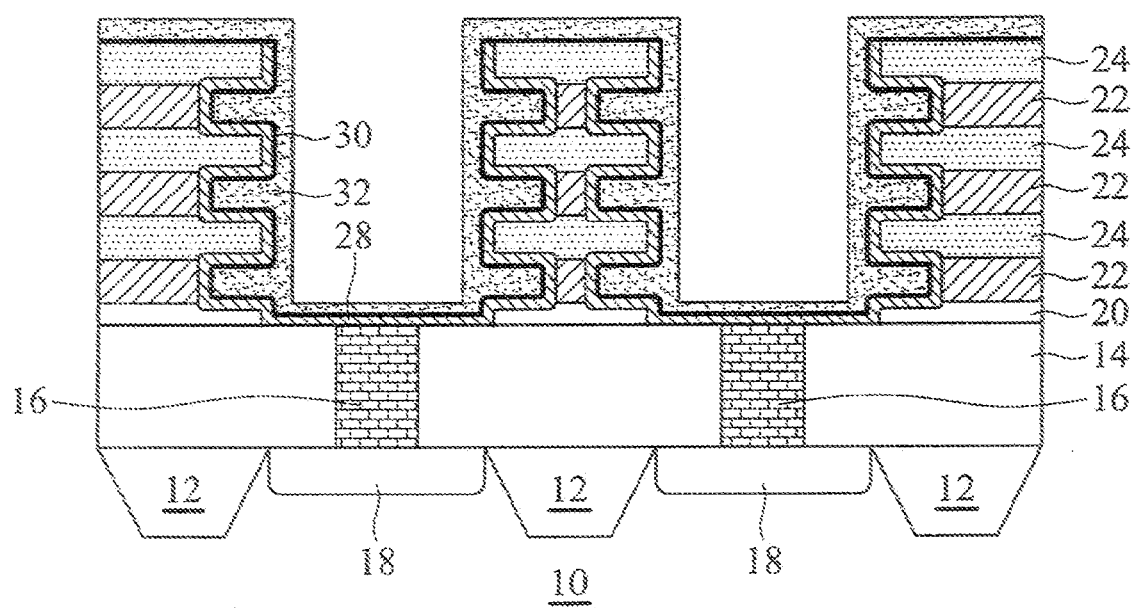

In FIG. 1F, a high-k dielectric layer 30 is conformally deposited on the resulted structure to cover the bottom electrode layer 28 and the top surface of the stack dielectric structure 21. Then a second conductive layer 32, serving as a top electrode layer of the MIM capacitor, is deposited on the high-k dielectric layer 30. The second conductive layer 32 may fill the lateral recesses 27. The high-k dielectric layer 30 sandwiched between the two conductive layers 28 and 32 acts a capacitor dielectric layer of the MIM capacitor. The high-k dielectric layer 30 is deposited through any of a variety of deposition techniques, including CVD, LPCVD, APCVD, PECVD, ALD and the like. The term "high-k" as used herein denotes a dielectric that has a dielectric constant (k) of greater than about 4.0, preferably from about 8 to about 50. It is noted that all the dielectric constants disclosed herein are relative to a vacuum, unless otherwise stated. A wide variety of high-k dielectrics may be employed including, but not limited to: binary metal oxides such as $Ta_2O_5$, $HfO_2$, $Al_2O_3$, $InO_2$, $La_2O_3$, $ZrO_2$ and $TaO_2$; silicates, aluminates and oxynitrides of said binary metal oxides; and perovskite-type oxides. Combinations and/or multilayers of such high-k dielectrics are also contemplated herein. The material used to form the second conductive layer 32 may include, for example TiN, TaN, W, WN, Ti, TiW, Ta, Al, Cu, Mo, or the like. The blanket deposition for the second conductive layer 32 may include, but is not limited to, CVD, PVD (physical vapor deposition), evaporation, plating, ALD (atomic layer deposition), or combinations thereof.

The MIM capacitor process of the exemplary embodiment is an easily-controlled process which uses a wet etch solution with a high etch selectivity between the dielectric layers 22 and 24 to pull back the second dielectric layer 22 and form the serrate sidewall profile, resulting in an increase in the total effective capacitance without impacting on bit line contact aspect ratio.

Figure 2A:
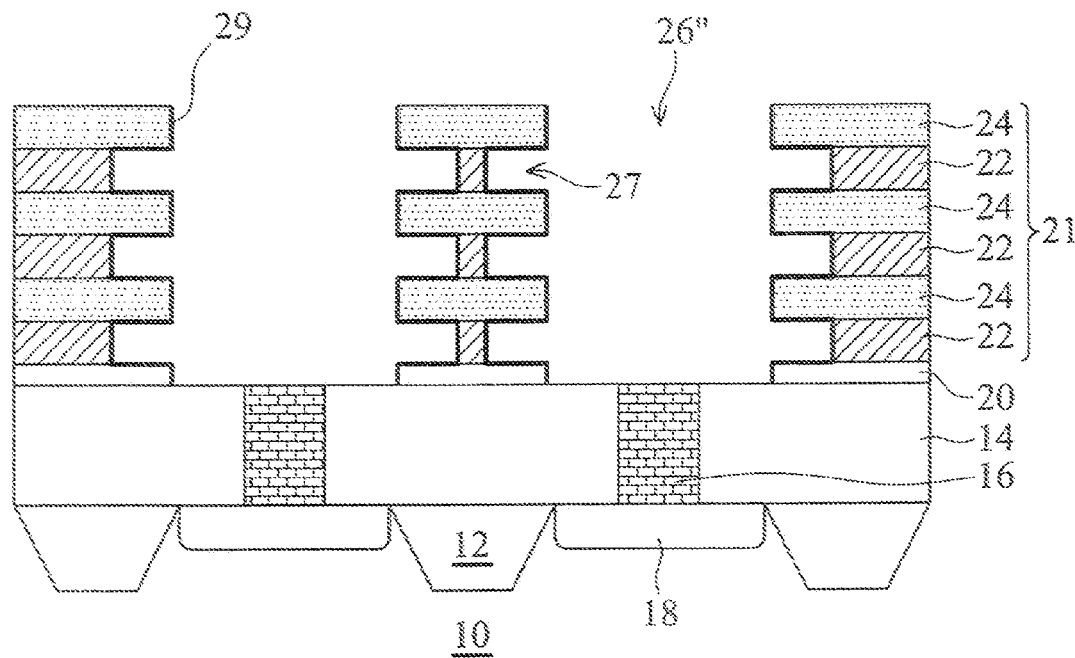
FIG. 2A to FIG. 2C are cross-sectional diagrams illustrating another exemplary embodiment of a MIM capacitor process using an isolation layer before the bottom electrode deposition.
Figure 2B:
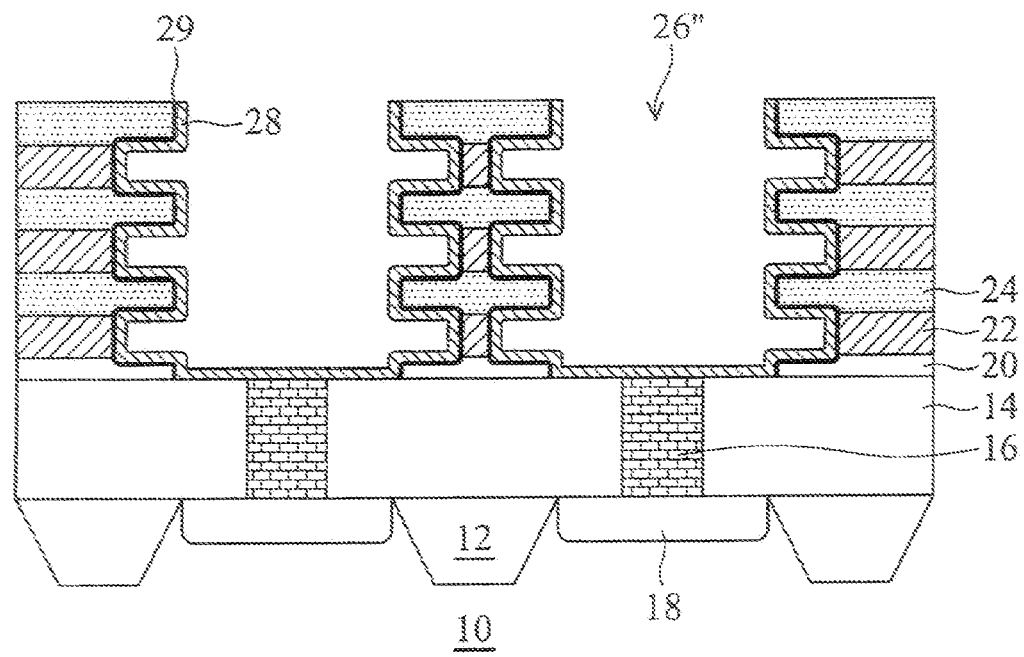
Figure 2C:
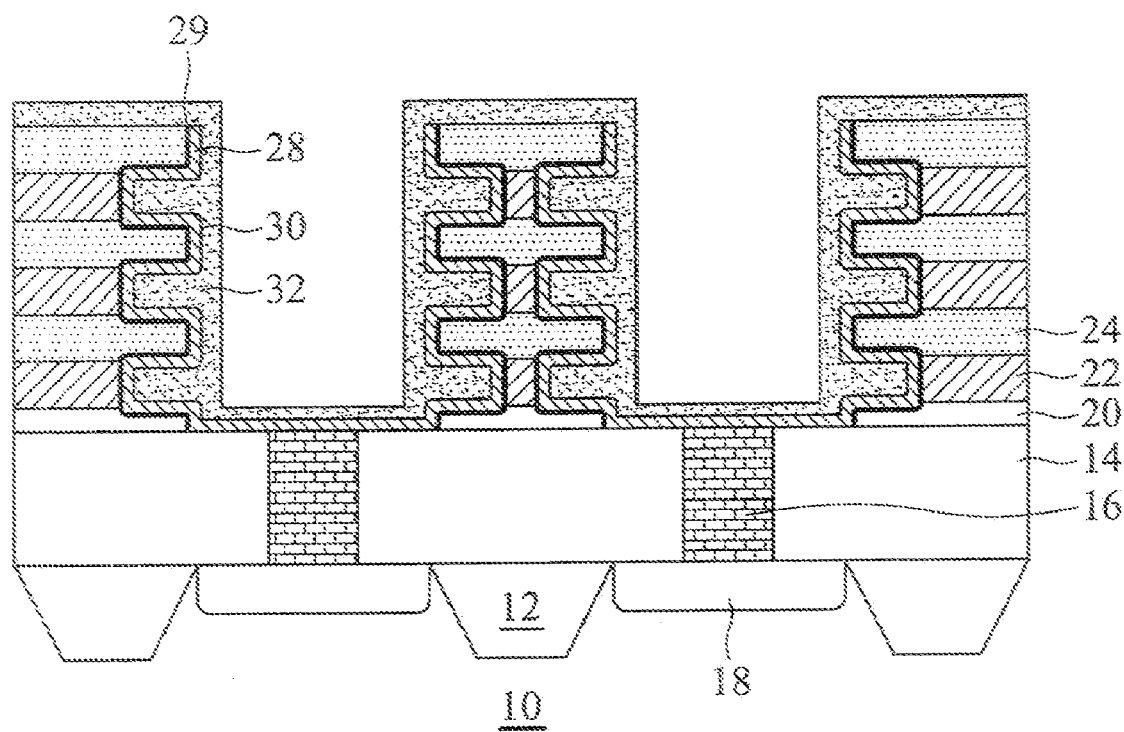

FIG. 2A to FIG. 2C are cross-sectional diagrams illustrating another exemplary embodiment of a MIM capacitor process using an isolation layer before the bottom electrode deposition, while explanation of the same or similar portions to the description in FIG. 1A-1F will be omitted. After the formation of lateral recesses 27 in the second dielectric layers 22, an isolation layer 29 is deposited on the resulted structure and then an etch back process is employed to remove the isolation layer 29 from the exposed surfaces of the first dielectric layer 14, the storage node contact structure 16 and the top of the stack dielectric structure 21 as depicted in FIG. 2A. The isolation layer 29 may be formed of oxide, silicon oxynitride, silicon nitride, tantalum oxide, aluminum oxide, zirconium oxide, or combinations thereof. Next, as shown in FIG. 2B, a first conductive layer 28 is deposited along the serrate sidewalls of the patterned openings 26" to cover the isolation layer 29, the first dielectric layer 14, the storage node contact structure 16 and the top of the stack dielectric structure 21. The first conductive layer 28 outside the patterned opening 26" is then removed by CMP process. Next, in FIG. 2C, a high-k dielectric layer 30 is conformally deposited to cover the bottom electrode 28 and the top of the stack dielectric structure 21, and then a second conductive layer 32 is deposited on the high-k dielectric layer 30. The high-k dielectric layer 30 sandwiched between the two conductive layers 28 and 32 acts a capacitor dielectric. The additional isolation layer 29 can further reduce capacitor-to-capacitor leakage to improve the capacitor performance.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A metal-insulator-metal capacitor, comprising:
   a semiconductor substrate having a first dielectric layer formed thereon;
   a stack dielectric structure overlying said first dielectric layer,
      wherein said stack dielectric structure comprises a plurality of second dielectric layers and a plurality of third dielectric layers alternating with each other, and a wet etch selectivity of said second dielectric layer relative to said third dielectric layer is of at least 5:1,
      wherein an opening has serrate sidewalls passing through said stack dielectric structure and a bottom exposing a portion of said first dielectric layer;
   a bottom electrode layer formed on said stack dielectric structure and said first dielectric layer along said serrate sidewalls and said bottom of said opening;
   an isolation layer formed between said stack dielectric structure and said bottom electrode layer;
   a capacitor dielectric layer formed on said bottom electrode layer; and
   a top electrode layer formed on said capacitor dielectric layer.

2. The metal-insulator-metal capacitor of claim 1, wherein a wet etch selectivity of said second dielectric layer relative to said third dielectric layer is of at most 100:1.

3. The metal-insulator-metal capacitor of claim 1, wherein said second dielectric layer and said third dielectric layer are formed of oxide-based materials.

4. The metal-insulator-metal capacitor of claim 1, wherein said isolation layer comprises oxide, silicon oxynitride, silicon nitride, tantalum oxide, aluminum oxide, zirconium oxide, or combinations thereof.

5. The metal-insulator-metal capacitor of claim 1, further comprising a storage node contact structure formed in said first dielectric layer and electrically connecting to said bottom electrode layer.

6. A metal-insulator-metal capacitor, comprising:
   a semiconductor substrate having a first dielectric layer formed thereon;
   a stack dielectric structure overlying said first dielectric layer,
      wherein said stack dielectric structure comprises a plurality of second dielectric layers and a plurality of third dielectric layers alternating with each other, and a wet etch selectivity of said second dielectric layer relative to said third dielectric layer is of at least 5:1,
      wherein an opening has serrate sidewalls passing through said stack dielectric structure and a bottom exposing a portion of said first dielectric layer;
   a bottom electrode layer formed on said stack dielectric structure and said first dielectric layer along said serrate sidewalls and said bottom of said opening;
   a capacitor dielectric layer formed on said bottom electrode layer; and
   a top electrode layer formed on said capacitor dielectric layer without fully filling said opening.

* * * * *